(12) United States Patent
Bae et al.

(10) Patent No.: US 11,368,341 B2
(45) Date of Patent: Jun. 21, 2022

(54) SIGNAL PROCESSING METHOD AND SYSTEM, AND NON-TRANSITORY COMPUTER-READABLE RECORDING MEDIUM

(71) Applicant: Korea Advanced Institute Of Science And Technology, Daejeon (KR)

(72) Inventors: Hyeon Min Bae, Daejeon (KR); Se Jun Jeon, Daejeon (KR)

(73) Assignee: Korea Advanced Institute Of Science And Technology, Daejeon (KR)

( * ) Notice: Subject to any disclaimer, the term of this patent is extended or adjusted under 35 U.S.C. 154(b) by 0 days.

(21) Appl. No.: 16/968,673

(22) PCT Filed: Feb. 11, 2019

(86) PCT No.: PCT/KR2019/001626
§ 371 (c)(1),
(2) Date: Aug. 10, 2020

(87) PCT Pub. No.: WO2019/156517
PCT Pub. Date: Aug. 15, 2019

(65) Prior Publication Data
US 2021/0051049 A1    Feb. 18, 2021

(30) Foreign Application Priority Data

Feb. 9, 2018   (KR) .................. 10-2018-0016353
Nov. 29, 2018  (KR) .................. 10-2018-0151431

(51) Int. Cl.
*H03K 9/08*   (2006.01)
*H04L 27/00*  (2006.01)
*H03K 7/08*   (2006.01)

(52) U.S. Cl.
CPC .......... *H04L 27/0014* (2013.01); *H03K 7/08* (2013.01)

(58) Field of Classification Search
CPC ..... H04L 25/4902; H04L 27/04; G01S 13/78; G06F 3/033; H04B 1/525; H04B 1/10; H03K 7/08
(Continued)

(56) References Cited

U.S. PATENT DOCUMENTS 6,437,710 B1 * 8/2002 Tam ................ H04L 25/493
                                              341/58
2009/0134948 A1 * 5/2009 Miwa ................ G08C 23/04
                                              332/112

(Continued)

FOREIGN PATENT DOCUMENTS

JP    2011503985 A    1/2011
KR    1020030036660 A    5/2003
(Continued)

OTHER PUBLICATIONS

International Search Report of PCT/KR2019/001626 dated May 24, 2019.
(Continued)

*Primary Examiner* — Khai Tran
(74) *Attorney, Agent, or Firm* — Dinsmore & Shohl LLP; Yongsok Choi, Esq.

(57) ABSTRACT

According to one aspect of the invention, there is provided a signal processing method, wherein a frame is generated in which at least one position of occurrence of a transition in a pulse value is determined from an input bitstream. According to another aspect of the invention, there is provided a signal processing method, wherein a frame including at least one pulse having a pulse width not less than a minimum pulse width is generated from an input bitstream.

18 Claims, 15 Drawing Sheets

(58) Field of Classification Search
USPC .......................... 375/238, 237; 327/33, 155
See application file for complete search history.

(56) References Cited

U.S. PATENT DOCUMENTS

| | | |
|---|---|---|
| 2009/0232197 A1 | 9/2009 | Mimura et al. |
| 2013/0003905 A1* | 1/2013 | Jain .................... H03K 5/1534 |
| | | 375/360 |
| 2015/0043619 A1 | 2/2015 | Bakin et al. |
| 2017/0244584 A1 | 8/2017 | Dress |

FOREIGN PATENT DOCUMENTS

| | | |
|---|---|---|
| KR | 1020060099805 A | 9/2006 |
| KR | 1020110138136 A | 12/2011 |

OTHER PUBLICATIONS

S. Jeon, et al., "A 20Gb/s Transceiver With Framed-Pulsewidth Modulation In 40nm CMOS," 2018 IEEE International Solid-State Circuits Conference—(ISSCC), 2018, pp. 270-272.

W. Wang, et al., "A 10-GB/s, 107-mW Double-Edge Pulsewidth Modulation Transceiver," in IEEE Transactions on Circuits and Systems I: Regular Papers, vol. 61, No. 4, pp. 1068-1080, Apr. 2014.

* cited by examiner

SIGNAL PROCESSING METHOD AND SYSTEM, AND NON-TRANSITORY COMPUTER-READABLE RECORDING MEDIUM

CROSS-REFERENCE TO RELATED APPLICATION(S)

This application is a national stage of Patent Cooperation Treaty (PCT) International Application No. PCT/KR2019/001626 filed on Feb. 11, 2019, which claims priority to Korean Patent Application Nos. 10-2018-0016353 and 10-2018-0151431 filed on Feb. 9, 2018 and Nov. 29, 2018, respectively. The entire contents of PCT International Application No. PCT/KR2019/001626 and Korean Patent Application Nos. 10-2018-0016353 and 10-2018-0151431 are hereby incorporated by reference.

FIELD OF THE INVENTION

The present invention relates to a signal processing method, system, and non-transitory computer-readable recording medium.

BACKGROUND

In recent years, due to data traffic increase and big data environment, there is increasing demand for a data transceiver having a rate of several tens or hundreds of Gb/s or higher.

In general, when the bandwidth of a signal is expanded in high-speed communication, inter-symbol interference (ISI) increases and spectral efficiency decreases. Accordingly, a lot of research is being conducted in order to improve conventional signal modulation schemes (e.g., pulse-amplitude modulation (PAM), pulse-width modulation (PWM), permutation modulation (PM), and duobinary signaling) to produce a data transceiver with high processing speed and high efficiency.

In connection with the foregoing, although a non-return-to-zero (NRZ) signal transmission system or the like is known to be suitable for implementing the IEEE 802.3bs standard to operate in 200 Gb/s and 400 Gb/s Ethernets, there is a limitation that higher performance cannot be achieved considering insertion loss for each frequency in the signal transmission system.

In addition, when a multi-level signal transmission system is employed, linearity of the system is required more strictly than the NRZ signal transmission system or the like, and it is difficult to overcome a limitation that a signal-to-noise ratio (SNR) is reduced.

In this connection, the inventor(s) present a novel and inventive next-generation signal processing technique for overcoming the above problems.

SUMMARY OF THE INVENTION

One object of the present invention is to solve all the above-described problems.

Another object of the invention is to prevent signal-to-noise ratio (SNR) reduction without requiring linearity even when throughput is increased.

Yet another object of the invention is to improve signal transmission quality while reducing power consumed in transmission and reception.

The representative configurations of the invention to achieve the above objects are described below.

According to one aspect of the invention, there is provided a signal processing method, wherein a frame is generated in which at least one position of occurrence of a transition in a pulse value is determined from an input bitstream.

According to another aspect of the invention, there is provided a signal processing method, wherein information on at least one position of occurrence of a transition in a pulse value is detected from a frame, and an output bitstream is generated from the detected information.

According to one aspect of the invention, there is provided a signal processing system comprising an encoding unit configured to generate a frame in which at least one position of occurrence of a transition in a pulse value is determined from an input bitstream.

According to another aspect of the invention, there is provided a signal processing system comprising a decoding unit configured to detect information on at least one position of occurrence of a transition in a pulse value from a frame, and to generate an output bitstream from the detected information.

According to yet another aspect of the invention, there is provided a communication system comprising: an encoding unit configured to generate a frame in which at least one position of occurrence of a transition in a pulse value is determined from an input bitstream; and a decoding unit configured to detect information on at least one position of occurrence of a transition in a pulse value from a frame, and to generate an output bitstream from the detected information.

According to one aspect of the invention, there is provided a signal processing method, wherein a frame including at least one pulse having a pulse width not less than a minimum pulse width is generated from an input bitstream.

According to another aspect of the invention, there is provided a signal processing method, wherein information on at least one pulse included in a frame and having a pulse width not less than a minimum pulse width is detected, and an output bitstream is generated from the detected information.

According to one aspect of the invention, there is provided a signal processing system comprising an encoding unit configured to generate a frame including at least one pulse having a pulse width not less than a minimum pulse width from an input bitstream.

According to another aspect of the invention, there is provided a signal processing system comprising a decoding unit configured to detect information on at least one pulse included in a frame and having a pulse width not less than a minimum pulse width, and to generate an output bitstream from the detected information.

According to yet another aspect of the invention, there is provided a communication system comprising: an encoding unit configured to generate a frame including at least one pulse having a pulse width not less than a minimum pulse width from an input bitstream; and a decoding unit configured to detect information on at least one pulse included in a frame and having a pulse width not less than the minimum pulse width, and to generate an output bitstream from the detected information.

In addition, there are further provided other methods and systems to implement the invention, as well as non-transitory computer-readable recording media having stored thereon computer programs for executing the methods.

According to the invention, it is possible to prevent signal-to-noise ratio (SNR) reduction without requiring linearity even when throughput is increased.

According to the invention, it is possible to improve signal transmission quality while reducing power consumed in transmission and reception.

DETAILED DESCRIPTION

Figure 1:
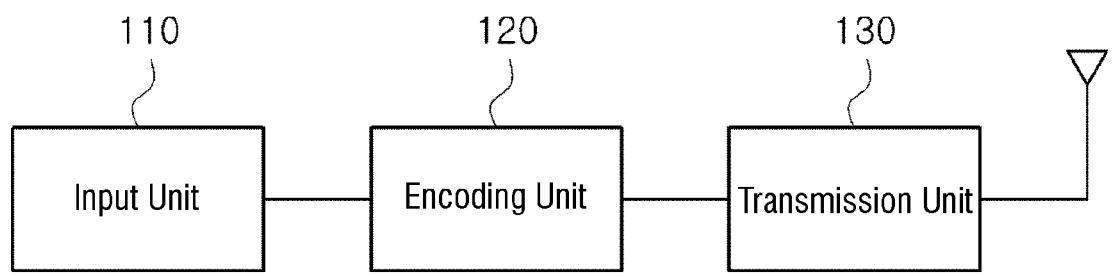
FIG. 1 illustratively shows the configuration of an entire signal processing system according to one embodiment of the invention.

In the following detailed description of the present invention, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different from each other, are not necessarily mutually exclusive. For example, specific shapes, structures, and characteristics described herein may be implemented as modified from one embodiment to another without departing from the spirit and scope of the invention. Furthermore, it shall be understood that the locations or arrangements of individual elements in each of the disclosed embodiments may also be modified without departing from the spirit and scope of the invention. Therefore, the following detailed description is not to be taken in a limiting sense, and the scope of the invention is to be taken as encompassing the scope of the appended claims and all equivalents thereof. In the drawings, like reference numerals refer to the same or similar functions throughout the several views.

Hereinafter, preferred embodiments of the present invention will be described in detail with reference to the accompanying drawings to enable those skilled in the art to easily implement the invention.

Configuration of the Entire System

Figure 2:
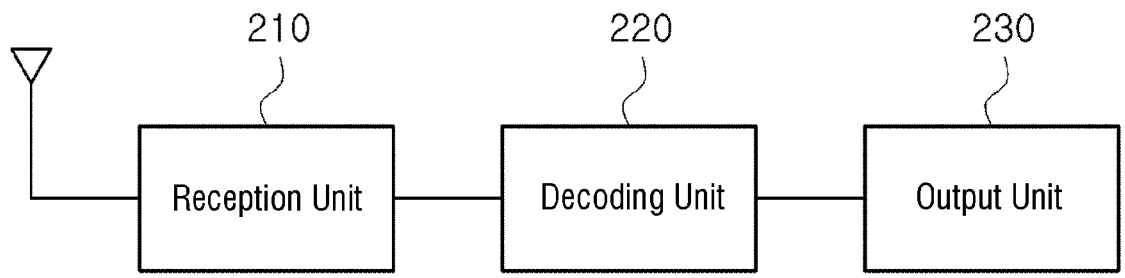
FIG. 2 illustratively shows the configuration of an entire signal processing system according to one embodiment of the invention.

FIGS. 1 and 2 illustratively show the configuration of an entire signal processing system according to one embodiment of the invention.

Referring to FIGS. 1 and 2, a transmitter 100 according to one embodiment of the invention may include an input unit 110, an encoding unit 120, and a transmission unit 130, and a receiver 200 according to one embodiment of the invention may include a reception unit 210, a decoding unit 220, and an output unit 230.

First, according to one embodiment of the invention, an input bitstream inputted through the input unit 110 may be processed by the encoding unit 120 and transmitted to the receiver 200 through the transmission unit 130.

Next, according to one embodiment of the invention, a signal received through the reception unit 210 (specifically, the signal transmitted from the transmitter 100) may be processed by the decoding unit 220 and outputted as an output bitstream through the output unit 230.

Hereinafter, operating principles of a signal processing system according to one embodiment of the invention will be discussed in detail with reference to FIGS. 3 to 13.

First, FIGS. 3 to 6 illustratively show a frame that may be used in a signal processing scheme according to one embodiment of the invention.

According to one embodiment of the invention, the above frame refers to a unit of signal processing and should be understood as the broadest concept encompassing a signal or a part of the signal that may be specified with respect to time. Specifically, according to one embodiment of the invention, a frame may include information on types, a number, widths, amplitudes (or values), times, or positions of pulses and information on types, a number, amplitudes, times, or positions of transitions in pulse values. Here, the positions may include not only absolute positions specified with respect to time, but also relative positions specified with respect to relationships with other pulses or transitions.

For example, according to one embodiment of the invention, three data-type pulses, two void-type pulses, and one flag-type pulse may be specified as one frame (e.g., one frame may be constituted by six pulses, in the order of a first data pulse, a first void pulse, a second data pulse, a second void pulse, a third data pulse, and a flag pulse).

Figure 3:
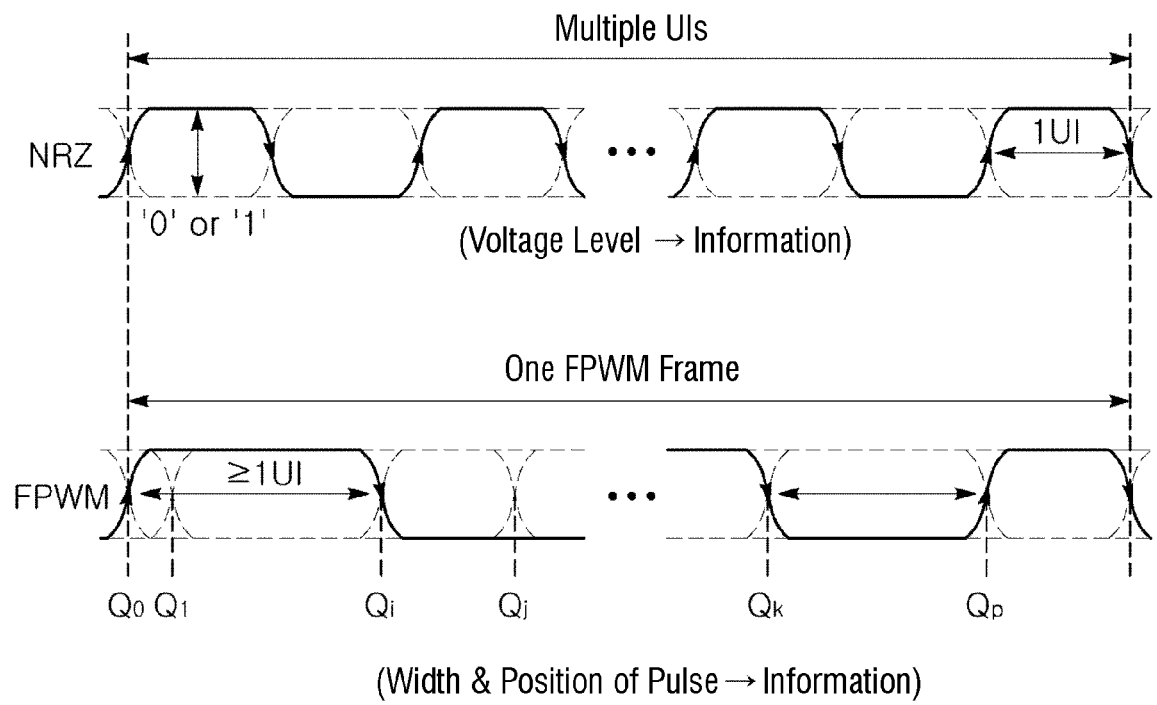
FIG. 3 illustratively shows a frame that may be used in a signal processing scheme according to one embodiment of the invention.

Referring to FIG. 3, in the case of using a non-return-to-zero (NRZ) modulation scheme, which is one of typical conventional modulation schemes, an input bitstream should be represented only by voltage levels. However, in the case of using a signal processing scheme according to the invention, an input bitstream may be modulated by framing the input bitstream on the basis of widths (specifically, not less than a minimum pulse width) and positions of pulses.

Figure 4:
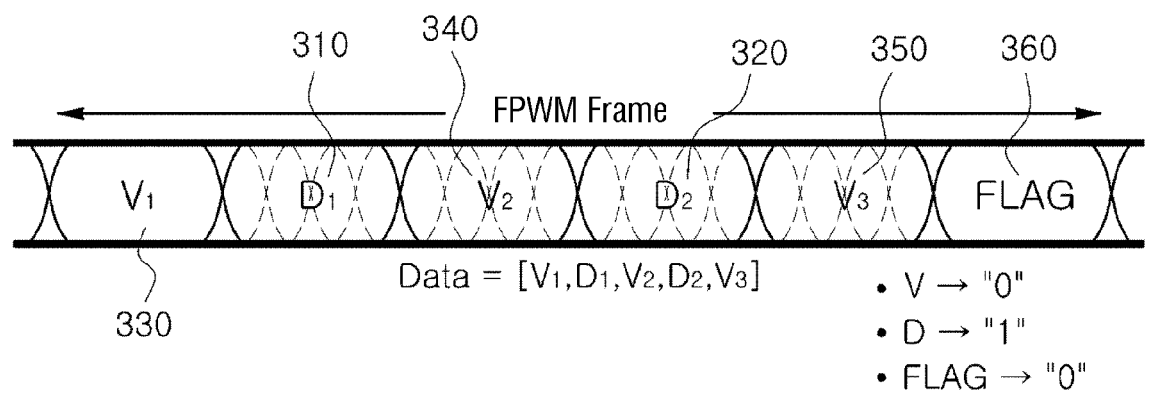
FIG. 4 illustratively shows a frame that may be used in a signal processing scheme according to one embodiment of the invention.
Figure 5:
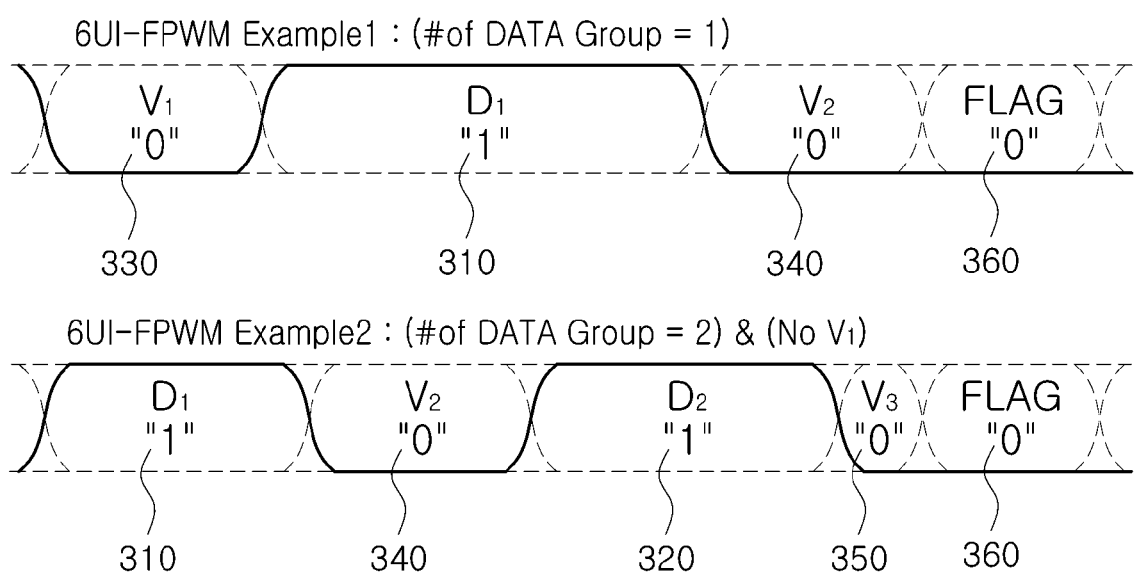
FIG. 5 illustratively shows a frame that may be used in a signal processing scheme according to one embodiment of the invention.

Referring to FIGS. 4 and 5, through modulation by the encoding unit 120 according to one embodiment of the invention, a frame including at least one data pulse 310 and 320 and at least one void pulse 330, 340, and 350 having pulse widths not less than a minimum pulse width may be generated from an input bitstream.

Further, the frame according to one embodiment of the invention may further include a flag pulse 360 for distinction from another frame. For example, the flag pulse according to one embodiment of the invention may be a pulse having a pulse width not less than the minimum pulse width and a pulse value of 0. However, it should be noted that according to the invention, the flag pulse is not necessarily included in the frame and may not be used if there is another means for distinguishing frames.

For example, according to one embodiment of the invention, the minimum pulse width of the data pulses 310 and 320, the void pulses 330, 340 and 350, and the flag pulse 360 may be 1 unit interval (UI), which may mean a symbol duration time, and a relationship with a period T of unit pulses constituting the minimum pulse width may be determined on the basis of a quantization number associated with the minimum pulse width. For example, when the minimum pulse width is 1 UI, a relationship between the UI and the period T of unit pulses constituting the UI may be determined on the basis of a quantization number applied to the UI.

More specifically, according to one embodiment of the invention, when the minimum pulse width is 1 UI and a quantization number applied to 1 UI is 4, the minimum pulse width of the data pulses 310 and 320, the void pulses 330, 340, and 350, and the flag pulse 360 may be determined as 4 T. That is, in this case, the width of each pulse may be set to 4 T or greater in order to block narrow pulses that are likely to occur due to inter-symbol interference (ISI). Meanwhile, the flag pulse may be fixed to the minimum pulse width of 1 UI (or 4 T when the quantization number is 4), as necessary.

Figure 6:
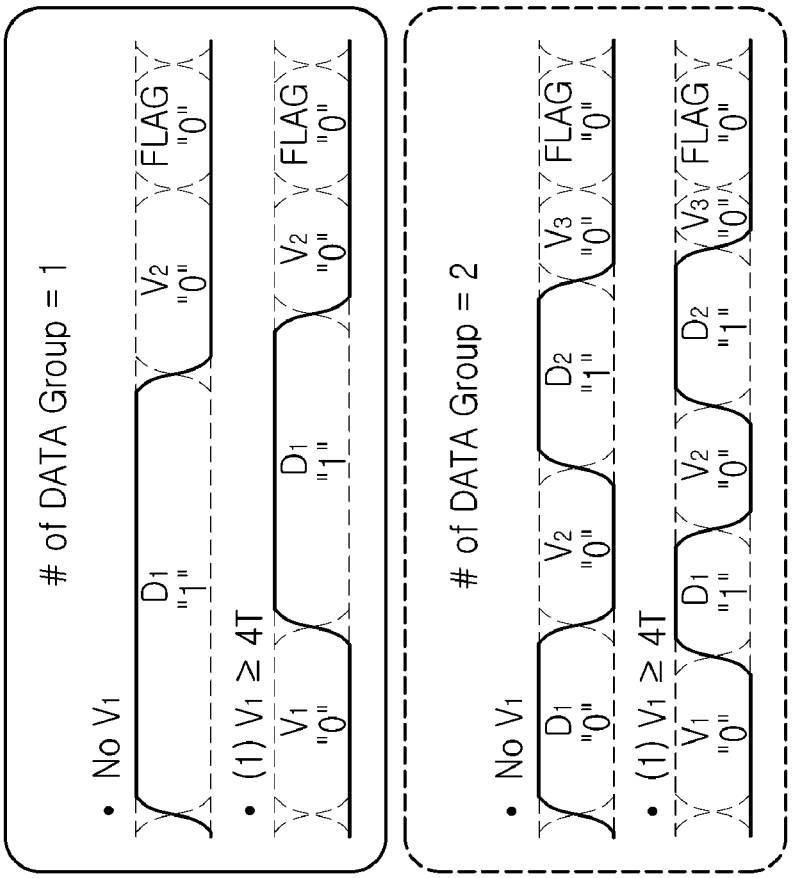
FIG. 6 illustratively shows a frame that may be used in a signal processing scheme according to one embodiment of the invention.
Figure 6:
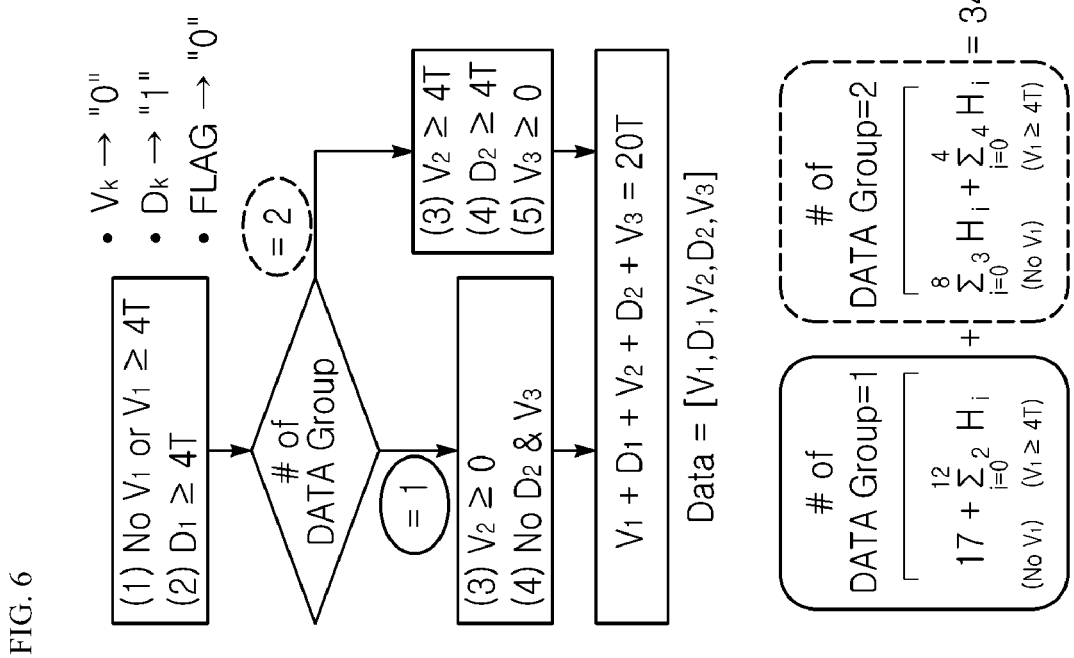

Referring to FIG. 6, according to one embodiment of the invention, it may be assumed that a minimum pulse width is 1 UI; a length of a frame is 6 UI; a maximum of two data pulses may be included in the frame; a period T of unit pulses constituting the UI is 0.25 UI (that is, the length of the frame may be 24 T in this case); and the minimum pulse width of each pulse is 4 T.

Specifically, according to one embodiment of the invention, the width of a flag pulse may be set to the minimum pulse width of 4 T, and the sum of the widths of data pulses and void pulses excluding the flag pulse (e.g., 4 T) may be 20 T. According to one embodiment of the invention, the number of frames that may be generated by combining the above data pulses and void pulses may be 343 (i.e., 8.34 bits), and thus a coding gain (($Bit_{FPWM}$−UI)/UI×100) that may be obtained through encoding (i.e., signal processing) according to the invention may be up to 39%. Further, when an 8-bit input bitstream is generated as one frame, a coding gain that may be obtained through encoding (i.e., signal processing) according to the invention may be 33%.

Figure 7:
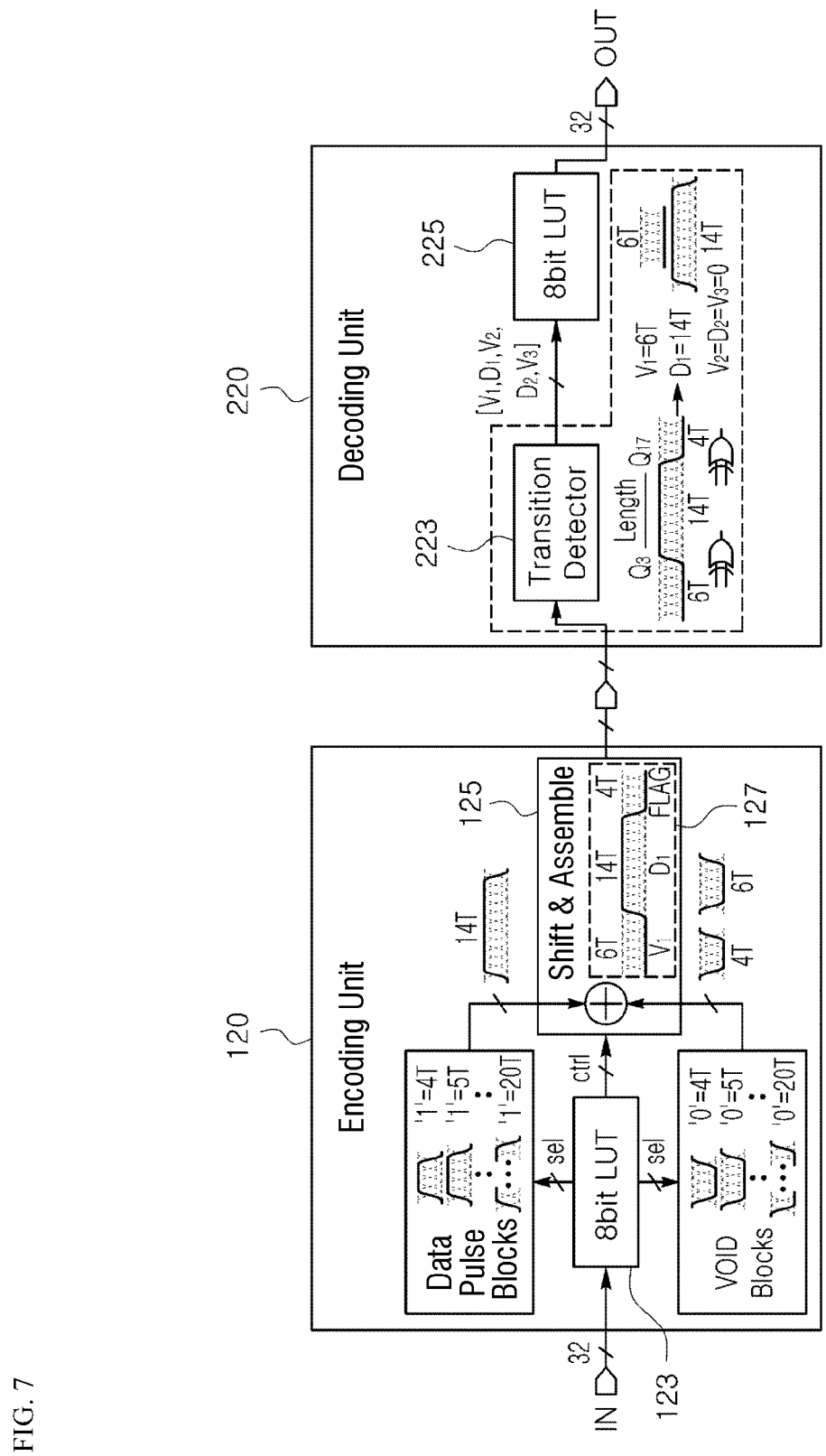
FIG. 7 illustratively shows how signal processing is performed according to one embodiment of the invention.

Next, FIG. 7 illustratively shows how signal processing is performed according to one embodiment of the invention.

Referring to FIG. 7, the encoding unit 120 according to one embodiment of the invention may determine widths and positions of at least one data pulse and at least one void pulse, with reference to a lookup table 123 defined on the basis of properties of an input bitstream, and may generate a frame from the input bitstream by performing operations (e.g., shift and assemble 125) on the determined widths and positions of the at least one data pulse and the at least one void pulse.

Further, according to one embodiment of the invention, the lookup table 123 may be defined on the basis of at least one of a number of bits of the input bitstream to be framed, a length of the frame (e.g., 6 UI), and a quantization number associated with the minimum pulse width (e.g., a quantization number applied to 1 UI).

For example, according to one embodiment of the invention, when an 8-bit input bitstream is generated as one frame such that a minimum pulse width is 1 UI, a length of the frame is 6 UI, a quantization number for 1 UI is set to 4, and a period T of unit pulses constituting the UI is 0.25 UI, the encoding unit 120 may refer to the lookup table 123 to select a void pulse having a pulse width of 6 T and a data pulse having a pulse width of 14 T corresponding to the input bitstream, among a plurality of pulses having pulse widths of 4 T to 20 T, and add a flag pulse having a pulse width of 4 T, thereby generating a frame 127 constituted by the void pulse having the pulse width of 6 T, the data pulse having the pulse width of 14 T, and the flag pulse having the pulse width of 4 T in that order.

Further, according to one embodiment of the invention, data corresponding to the length T may be defined as a unit block (i.e., a T-spaced unit block) (hereinafter referred to as "UB"), and the above frame having the length of 24 T may include 24 UBs.

That is, when an 32-bit input bitstream is continuously inputted by the input unit 110 according to one embodiment of the invention, the encoding unit 120 may refer to the lookup table 123 to generate four frames corresponding to the 32-bit input bitstream, and the four generated frames may include 96 UBs (i.e., 24 UBs for each frame).

Further, when a signal transmitted by the transmitter 100 according to one embodiment of the invention is received by the reception unit 210, the decoding unit 220 may detect information on at least one data pulse and at least one void pulse included in at least one frame of the received signal (specifically, information on widths or positions of the at least one data pulse and the at least one void pulse) (223), and may generate an output bitstream from the detected information with reference to a lookup table 225 defined on the basis of properties of an input bitstream corresponding to the frame.

For example, referring to FIG. 7, it may be assumed that four frames (i.e., 96 UBs) encoded by the encoding unit 120 according to one embodiment of the invention are received by the reception unit 210. In this case, the decoding unit 220 according to one embodiment of the invention may detect widths and positions of at least one data pulse and at least one void pulse, with respect to each of flag pulses included in the four received frames (i.e., four flag pulses). (For example, the detected information may indicate that the frame includes one void pulse and one data pulse in that order, and the pulse widths of the void pulse and the data pulse are 6 T and 14 T, respectively.) The decoding unit 220 may generate a 32-bit output bitstream corresponding to the detected widths and positions of the at least one data pulse and the at least one void pulse, with reference to the lookup table 225 defined on the basis of properties of an input bitstream corresponding to the frames.

Meanwhile, although the embodiments in which a frame corresponding to an input bitstream is generated, or an output bitstream corresponding to widths and pulses of data pulses and void pulses in the frame is generated with reference to a lookup table defined on the basis of properties of the input bitstream, have been mainly described above, the present invention is not necessarily limited to the above embodiments and any other methods (e.g., employing a combinational logic, a sequential logic, and the like) may be diversely utilized as long as the objects of the invention may be achieved.

Figure 8:
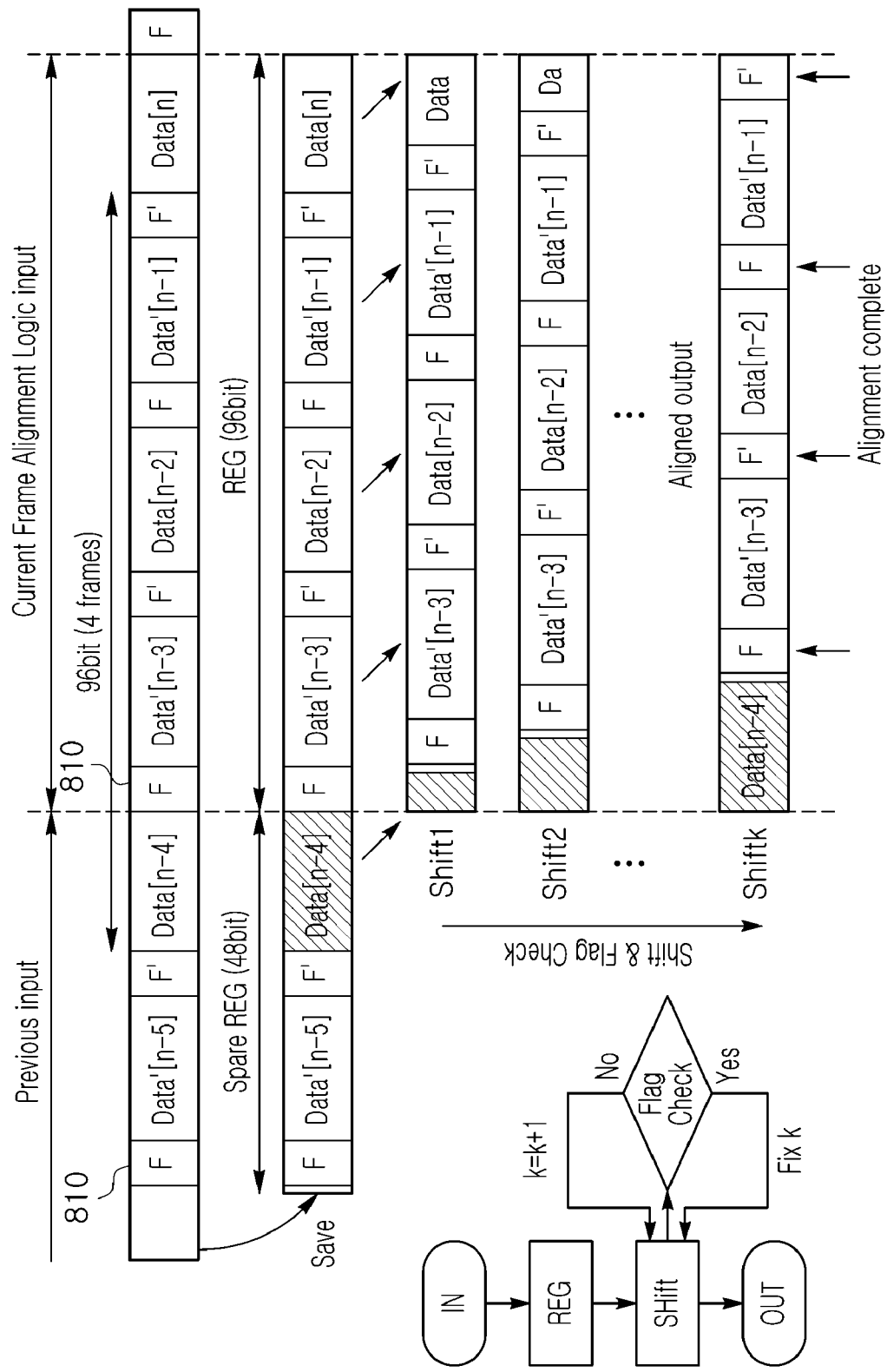
FIG. 8 illustratively shows how a plurality of frames are processed by a decoding unit according to one embodiment of the invention.

FIG. 8 illustratively shows how a plurality of frames are processed by the decoding unit 220 according to one embodiment of the invention.

Referring to FIG. 8, when a plurality of frames are received, the decoding unit 220 according to one embodiment of the invention may detect information on data pulses and void pulses for each of the frames by shifting at least one frame (e.g., simultaneously shifting all the frames by an interval of T) with respect to a flag pulse 810 included in each of the frames, and placing all the flag pulses at predetermined positions to align the frames.

Meanwhile, according to one embodiment of the invention, the frame alignment as above is not limited to being performed by the decoding unit 220 and may also be performed by a preprocessor 240 to be described below (e.g., a clock and data recovery (CDR) module that may be included in the preprocessor 240).

Figure 9:
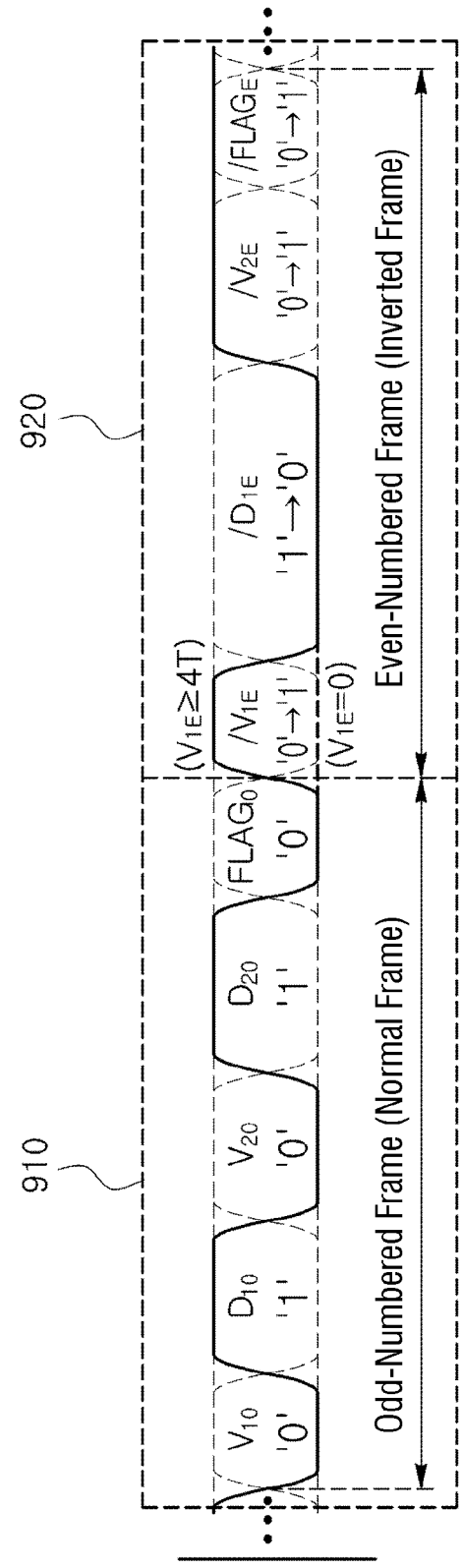
FIG. 9 illustratively shows how a plurality of frames are generated by an encoding unit according to one embodiment of the invention.

FIG. 9 illustratively shows how a plurality of frames are generated by the encoding unit 120 according to one embodiment of the invention.

Referring to FIG. 9, when the encoding unit 120 according to one embodiment of the invention generates a plurality of frames 910 and 920, an odd-numbered frame 910 or an even-numbered frame 920 among the generated frames may be inverted (specifically, electrically inverted) in order to maintain direct current (DC) balance of a signal.

Figure 10:
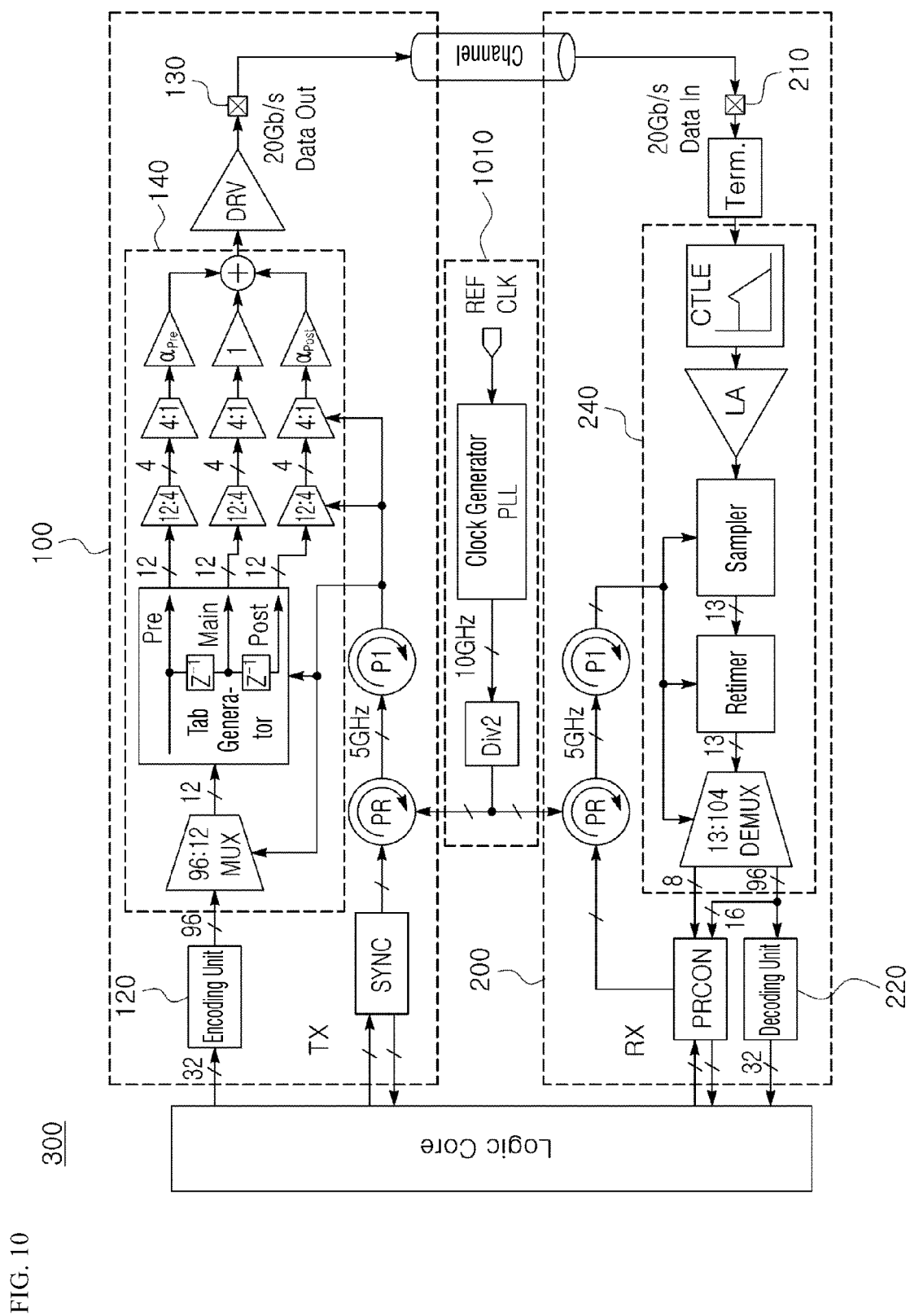
FIG. 10 illustratively shows a communication system including both of a transmitter and a receiver according to one embodiment of the invention.

FIG. 10 illustratively shows a communication system (e.g., a transceiver) 300 including both of the transmitter 100 and the receiver 200 according to one embodiment of the invention.

Figure 11:
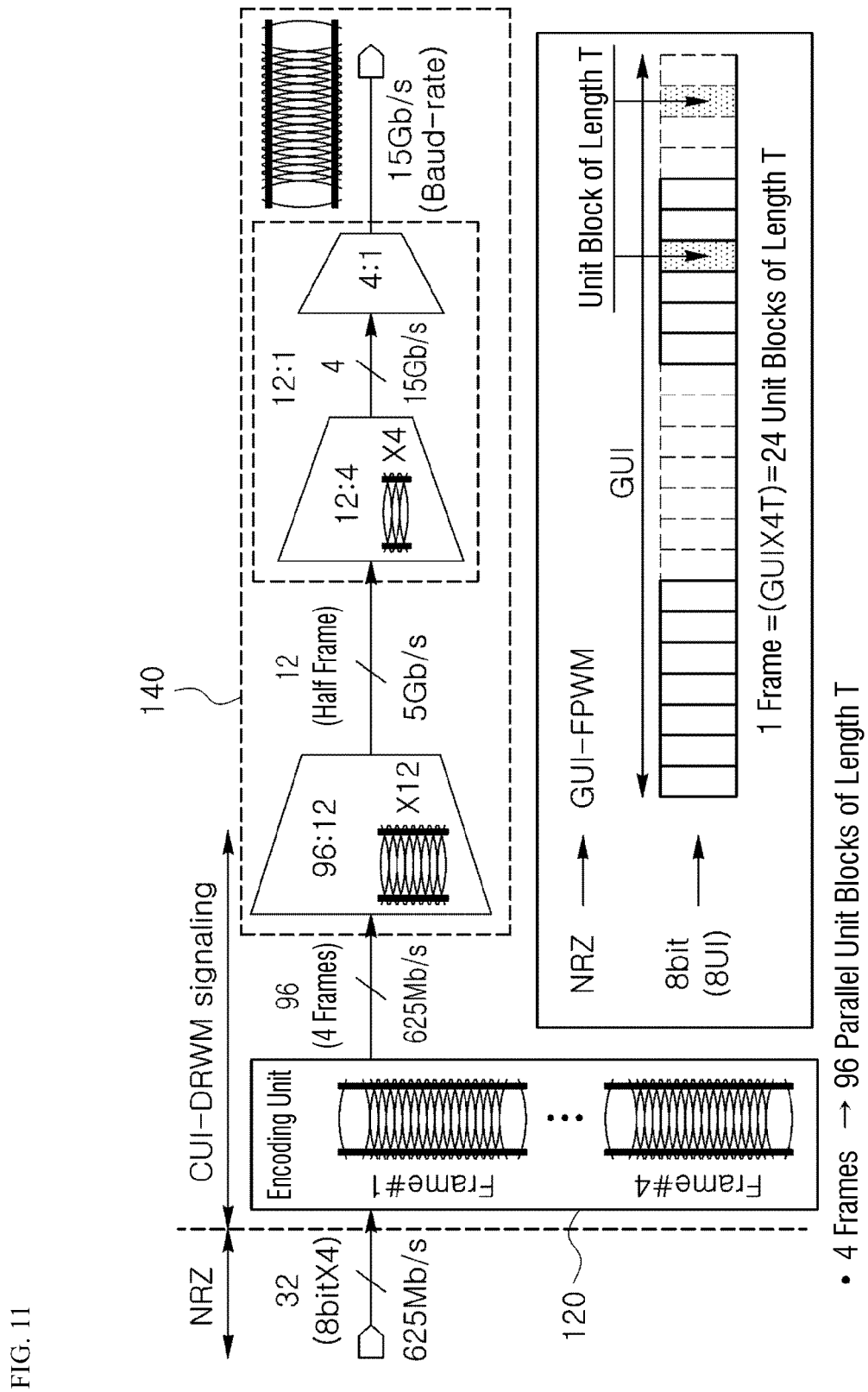
FIG. 11 illustratively shows a waveform of a signal modulated in a communication system according to one embodiment of the invention.

FIG. 11 illustratively shows a waveform of a signal modulated in the communication system 300 according to one embodiment of the invention.

Referring to FIG. 10, the transmitter 100 or the receiver 200 according to one embodiment of the invention may further include a preprocessor 140 or 240.

Specifically, in the transmitter 100 according to one embodiment of the invention, an input bitstream inputted by the input unit 110 may be modulated by the encoding unit 120 and the modulated signal may be preprocessed by the preprocessor 140 and then transmitted by the transmission unit 130.

For example, referring to FIGS. 10 and 11, according to one embodiment of the invention, when an 8-bit input bitstream is generated as one frame such that a minimum pulse width is 1 UI, a length of the frame is 6 UI, a quantization number for 1 UI is set to 4, and a period T of unit pulses constituting the UI is 0.25 UI, the encoding unit 120 may generate 96 UBs from a 32-bit input bitstream inputted by the input unit 110, and the preprocessor 140 may output 12 UBs (which may be data of 12 phases in this case) from the 96 UBs using a 96:12 multiplexer (MUX) and shift the outputted 12 UBs by a predetermined phase using a tab generator to output three sets of 12 UBs. Further, the preprocessor 140 according to one embodiment of the invention may perform operations on the three sets of 12 UBs using 12:4 and 4:1 MUXs to generate a final signal to be transmitted by the transmission unit 130.

Further, in the receiver 200 according to one embodiment of the invention, when a signal transmitted from the transmitter 100 (which may also be a signal transmitted from the transmitter 100 of another communication system 300) is received by the reception unit 210, the received signal may be preprocessed by the preprocessor 240 and then demodulated by the decoding unit 220, so that an output bitstream may be generated.

For example, according to one embodiment of the invention, the preprocessor 240 may preprocess the 12 UBs received by the reception unit 210, using a continuous time linear equalizer (CTLE), a limited amplifier (LA), a sampler, a retimer, and a 1:8 (or 13:104) demultiplexer (DEMUX). Further, the decoding unit 220 according to one embodiment of the invention may refer to a flag pulse included in each of the four frames (i.e., the 96 UBs generated by the above preprocessing) to detect information on at least one data pulse and at least one void pulse for each of the frames, and may refer to a lookup table to generate a 32-bit output bitstream. Meanwhile, according to one embodiment of the invention, the preprocessor 240 may demultiplex data including information on the received signal (e.g., the 12 UBs) and information on edges of pulses, and may provide the demultiplexed data to the decoding unit 220 and a clock and data recovery (CDR) module that may be coupled to the decoding unit 220.

Meanwhile, the communication system 300 according to one embodiment of the invention may further include a global clock signal generation unit 1010, which may function to distribute a clock signal generated through a reference clock to the transmitter 100 and the receiver 200.

For example, the global clock signal generation unit 1010 according to one embodiment of the invention may distribute a 10 GHz clock signal generated by a reference clock (whose frequency may be corrected by a phase locked loop (PLL)) to the transmitter 100 and the receiver 200 so that a 5 GHz clock signal may be respectively provided, and the preprocessors 140 and 240 of the transmitter 100 and the receiver 200 may operate on the basis of the provided clock signals. Meanwhile, the encoding unit 120 and the decoding unit 220 according to one embodiment of the invention may operate on the basis of the same clock (e.g., 625 MHz).

Meanwhile, according to one embodiment of the invention, in the transmitter 100 and the receiver 200 of the communication system 300, current mode logic (CML) gates are not used in configuring the internal logic, but CMOS logic gates may be used in order to reduce power consumption.

Figure 12:
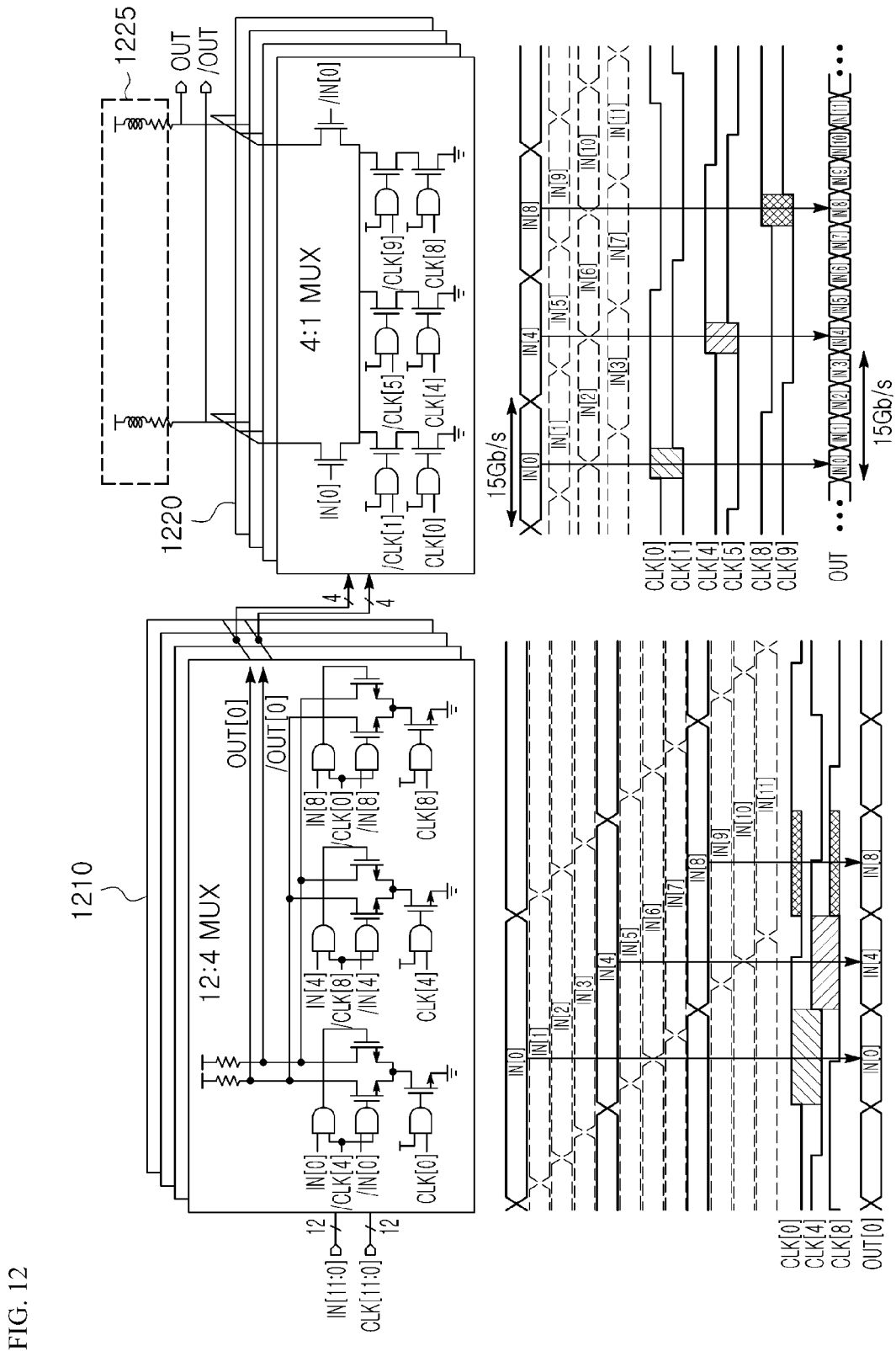
FIG. 12 illustratively shows the structures and operating principles of 12:4 and 4:1 multiplexers according to one embodiment of the invention.

FIG. 12 illustratively shows the structures and operating principles of the above-described 12:4 and 4:1 multiplexers according to one embodiment of the invention.

Referring to FIG. 12, 12:4 and 4:1 MUXs 1210 and 1220 according to one embodiment of the invention may be configured on the basis of static logic gates, without using CML-type MUXs, in order to reduce power consumption. Further, the 4:1 MUX 1220 according to one embodiment of the invention may include an inductive load 1225 in order to reduce power consumption and enhance bandwidth.

The operating principles of the 12:4 and 4:1 MUXs 1210 and 1220 according to one embodiment of the invention will be discussed. The 12:4 MUX 1210 may be configured to output multiplexed data when multiple phase clock signals having a predetermined phase difference (e.g., 120 degrees) are overlapped. Further, the 4:1 MUX 1220 according to one embodiment of the invention may realign the data outputted from the 12:4 MUX 1210 and output multiplexed data when a predetermined number (e.g., two) of adjacent phase clock signals are overlapped.

Figure 13:
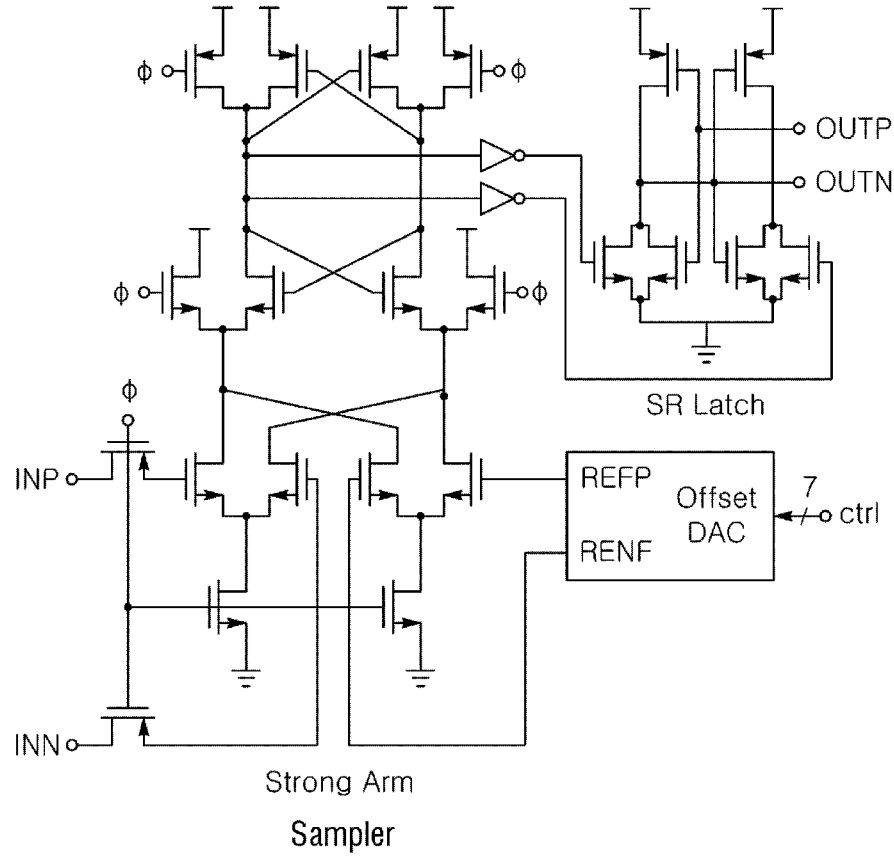
FIG. 13 illustratively shows the structure of a sampler according to one embodiment of the invention.

FIG. 13 illustratively shows the structure of a sampler according to one embodiment of the invention.

For example, the sampler according to one embodiment of the invention may be a sampler operating on the basis of track-and-hold. More specifically, the sampler according to one embodiment of the invention may be a CMOS sampler (e.g., a 12-phase quad-rate CMOS sampler) operating on the basis of track-and-hold.

The sampler according to one embodiment of the invention may be a sampler operating on the basis of a single phase clock signal. Through this operation, immunity against a duty cycle change of the clock signal and capacitance reduction in a data path may be achieved.

Test Results

Hereinafter, the results of tests using a communication system according to the invention will be discussed.

In the following tests, it is assumed that an 8-bit input bitstream is generated as one frame such that a minimum pulse width is 1 UI, a length of the frame is 6 UI, a quantization number for 1 UI is set to 4, and a period T of unit pulses constituting the UI is 0.25 UI.

Figure 14:
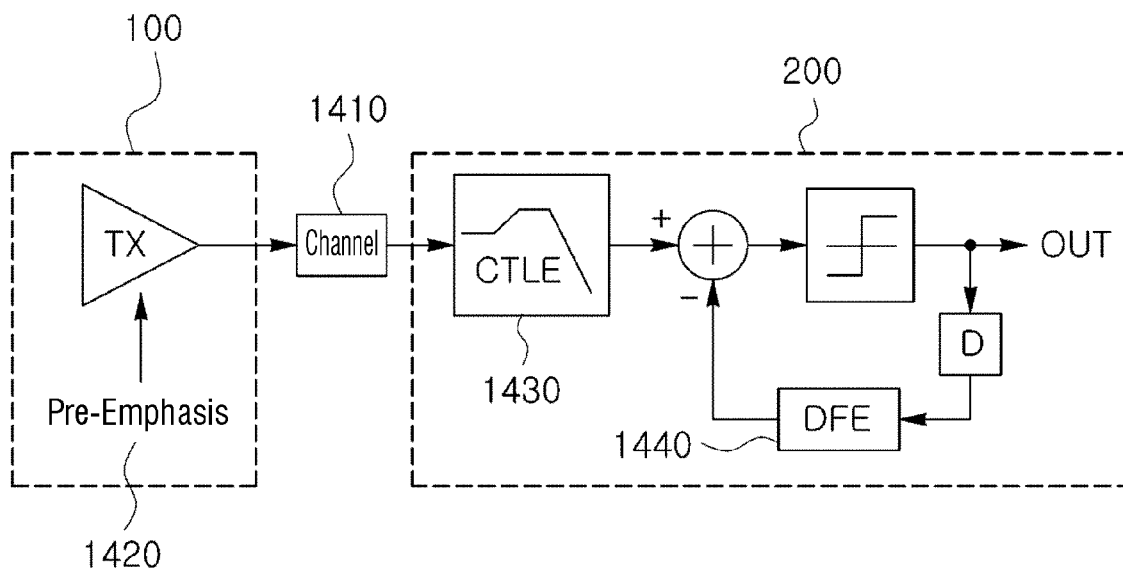
FIG. 14 shows a result of simulating a bit error rate (BER) and insertion loss occurring when transmission and reception are performed in a dispersive channel through a communication system according to one embodiment of the invention.
Figure 15:
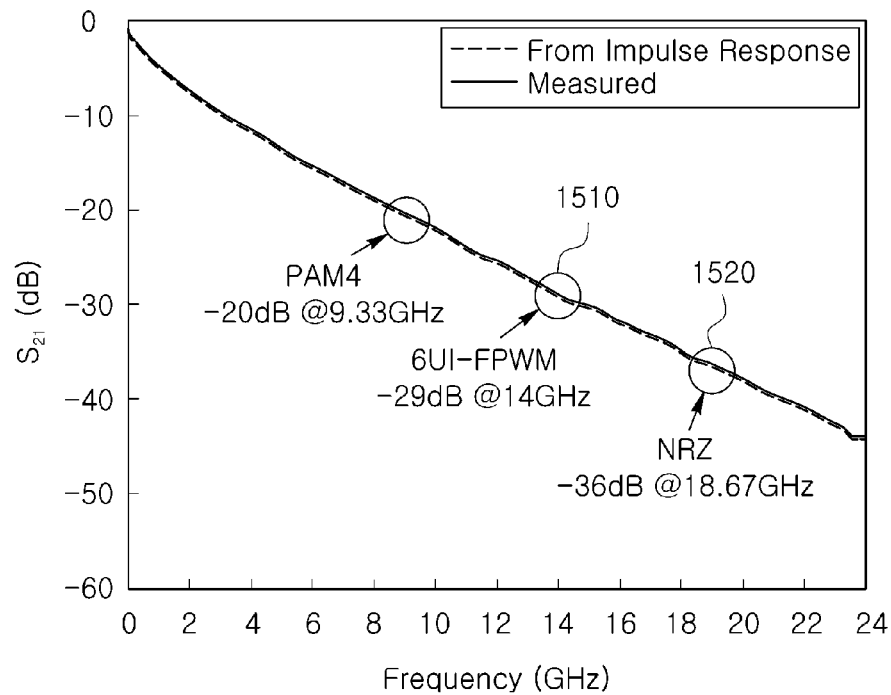
FIG. 15 shows a result of simulating a bit error rate (BER) and insertion loss occurring when transmission and reception are performed in a dispersive channel through a communication system according to one embodiment of the invention.
Figure 16:
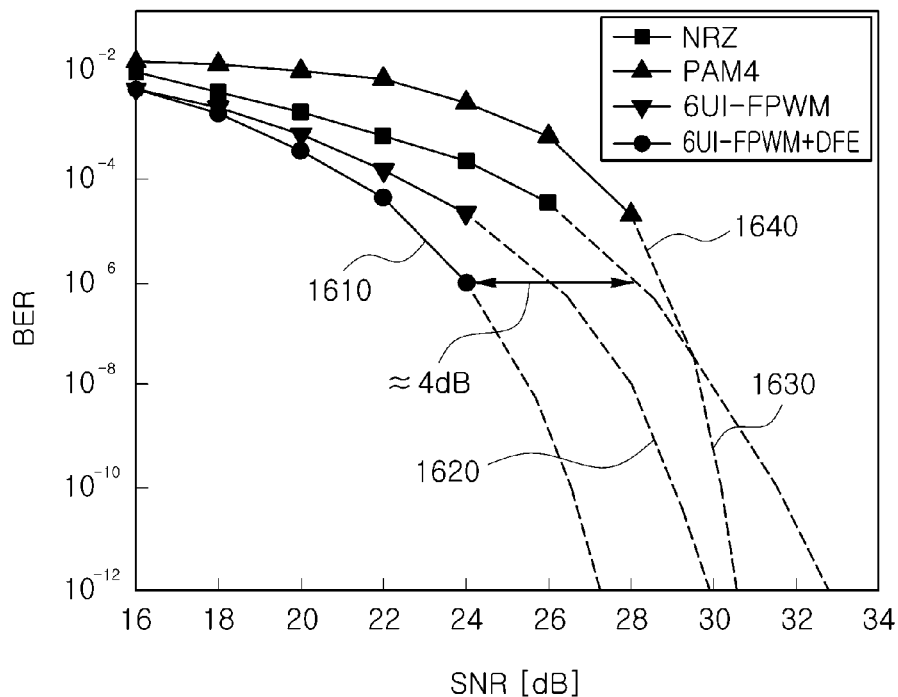
FIG. 16 shows a result of simulating a bit error rate (BER) and insertion loss occurring when transmission and reception are performed in a dispersive channel through a communication system according to one embodiment of the invention.

FIGS. 14 to 16 show a result of simulating a bit error rate (BER) and insertion loss occurring when transmission and reception are performed in a dispersive channel through a communication system according to one embodiment of the invention.

The circuit diagram shown in FIG. 14 shows an exemplary circuit for simulating a BER and insertion loss occurring when transmission and reception are performed in a dispersive channel 1410 through a communication system according to one embodiment of the invention. According to one embodiment of the invention, the transmitter 100 may further include a pre-emphasis 1420 in order to remove distortion according to the channel 1410, and the receiver 200 may further include a CTLE 1430 or a decision feedback equalizer (DFE) 1440.

In the graph shown in FIG. 15, the horizontal axis represents frequency and the vertical axis represents $S_{21}$ of S-parameters. Here, $S_{21}$ is shown in decibels (dB) and thus it may be determined that insertion loss decreases and spectral efficiency increases as $S_{21}$ approaches 0.

Referring to FIG. 15, it can be seen that $S_{21}$ of a signal processing scheme 1510 according to one embodiment of the invention is closer to zero by 7 dB than $S_{21}$ of a conventional non-return-to-zero (NRZ) modulation scheme 1520, and thus the signal processing scheme 1510 according to one embodiment of the invention exhibits higher transmission performance than the NRZ modulation scheme 1520.

In the graph shown in FIG. 16, the horizontal axis represents signal-to-noise ratio (SNR) and the vertical axis represents bit error rate. Here, a higher SNR indicates that transmission signal intensity and transmission power are greater, and a higher bit error rate indicates that there are more data errors and transmission performance is lower.

Referring to FIG. 16, it can be seen that the bit error rates of signal processing schemes 1610 and 1620 according to one embodiment of the invention are lower than those of a conventional non-return-to-zero (NRZ) modulation scheme 1630 and a conventional pulse-amplitude modulation (PAM) scheme 1640 all across the signal-to-noise ratio, and thus the signal processing schemes 1610 and 1620 according to one embodiment of the invention exhibit higher transmission performance than the NRZ modulation scheme 1630 and the PAM scheme 1640. Further, the signal processing scheme 1610 according to one embodiment of the invention in which the communication system according to the invention further includes a decision feedback equalizer (DFE) exhibits a lower bit error rate than the signal processing scheme 1620 according to one embodiment of the invention in which the communication system according to the invention does not include a DFE.

Figure 17:
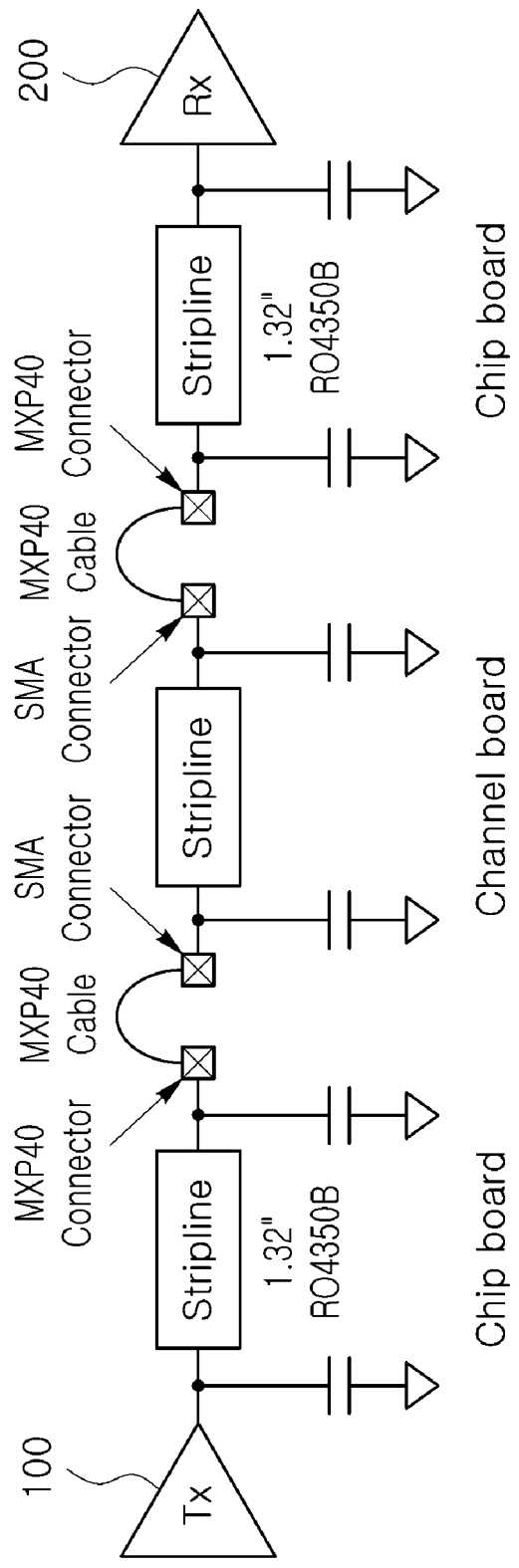
FIG. 17 shows a result of using FR4 to test a bit error rate (BER) and insertion loss occurring when transmission and reception are performed in a dispersive channel through a communication system according to one embodiment of the invention.
Figure 18:
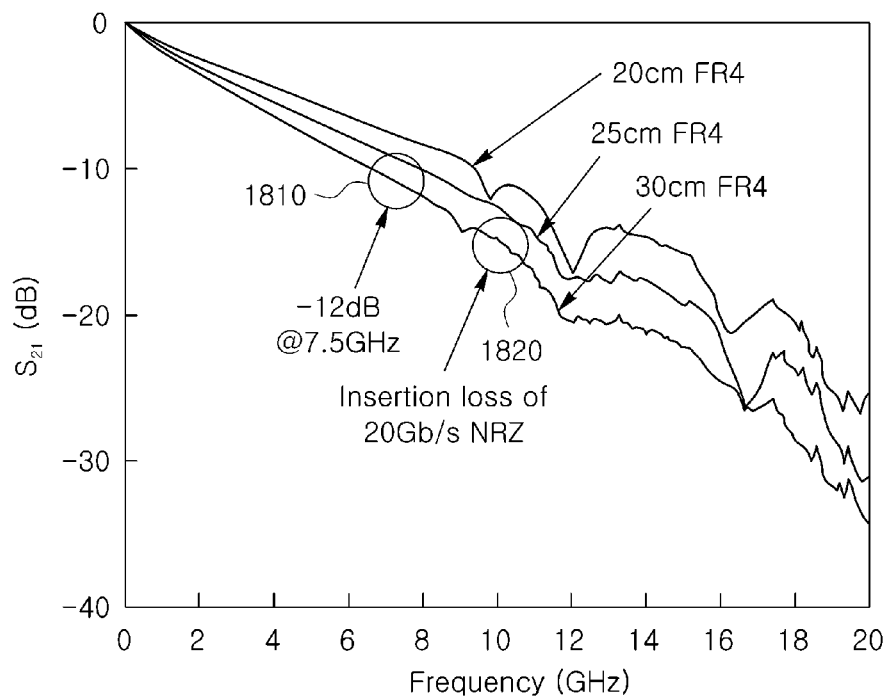
FIG. 18 shows a result of using FR4 to test a bit error rate (BER) and insertion loss occurring when transmission and reception are performed in a dispersive channel through a communication system according to one embodiment of the invention.
Figure 19:
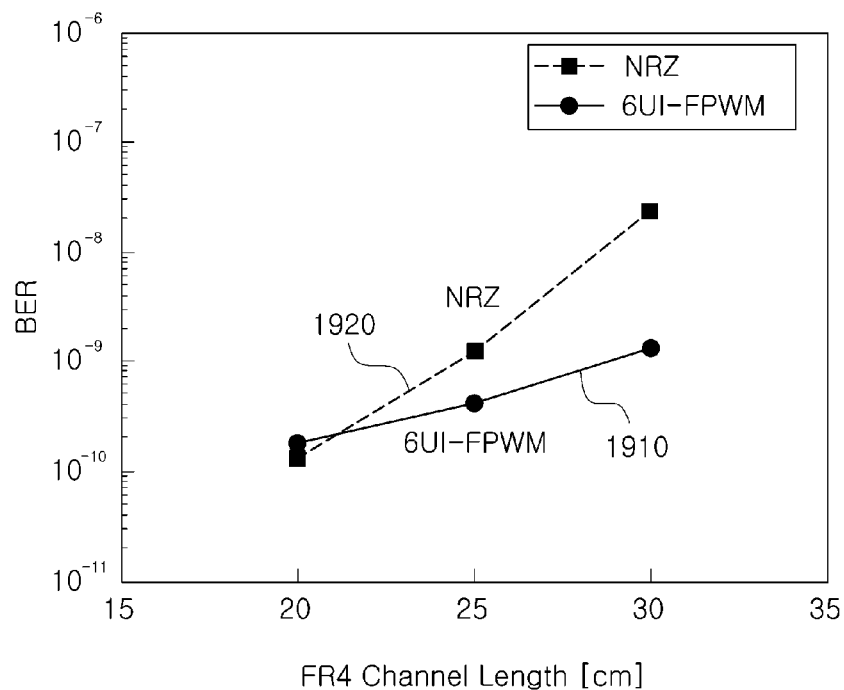
FIG. 19 shows a result of using FR4 to test a bit error rate (BER) and insertion loss occurring when transmission and reception are performed in a dispersive channel through a communication system according to one embodiment of the invention.

FIGS. 17 to 19 show a result of using FR4 to test a bit error rate (BER) and insertion loss occurring when transmission and reception are performed in a dispersive channel through a communication system according to one embodiment of the invention.

The circuit diagram shown in FIG. 17 shows an exemplary circuit for testing a BER and insertion loss occurring when transmission and reception are performed in a dispersive channel through a communication system according to one embodiment of the invention.

In the graph shown in FIG. 18, the horizontal axis represents frequency and the vertical axis represents $S_{21}$ of S-parameters. Here, $S_{21}$ is shown in decibels (dB) and thus insertion loss decreases and spectral efficiency increases as $S_{21}$ approaches 0.

Referring to FIG. 18, it can be seen that $S_{21}$ of a signal processing scheme 1810 according to one embodiment of the invention is closer to zero by 5 dB than $S_{21}$ of a conventional non-return-to-zero (NRZ) modulation scheme 1820 (specifically, in a situation in which the length of a FR4 channel is 30 cm), and thus the signal processing scheme 1810 according to one embodiment of the invention exhibits higher transmission performance than the NRZ modulation scheme 1820.

In the graph shown in FIG. 19, the horizontal axis represents the length of the FR4 channel and the vertical axis represents bit error rate. Here, a higher bit error rate indicates that there are more data errors and transmission performance is lower.

Referring to FIG. 19, it can be seen that the bit error rate (and the rate of change thereof) of a signal processing scheme 1910 according to one embodiment of the invention are lower than those of a conventional non-return-to-zero (NRZ) modulation scheme 1920 when the length of the FR4 channel is 20 cm or greater, and thus the signal processing scheme 1910 according to one embodiment of the invention exhibits higher transmission performance than the NRZ modulation scheme 1920.

Figure 20:
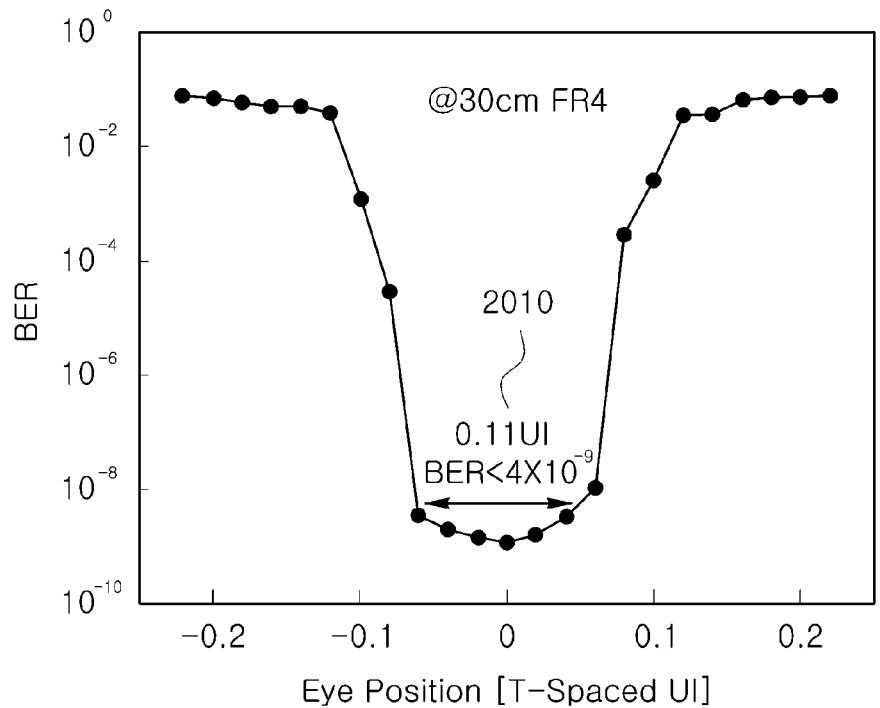
FIG. 20 shows a result of using FR4 to test a bit error rate (BER) and insertion loss occurring when transmission and reception are performed in a dispersive channel through a communication system according to one embodiment of the invention.

In the graph shown in FIG. 20, the horizontal axis represents eye pattern position (or T-Spaced UI) and the vertical axis represents bit error rate.

Referring to FIG. 20, it can be seen that the communication system according to one embodiment of the invention may obtain a bit error rate less than $4 \times 10^{-9}$ with an eye pattern interval of 0.11 UI (specifically, in a situation in which the length of the FR4 channel is 30 cm) (2010).

Meanwhile, upon analysis of the measured waveform of a signal transmitted and received through the communication system according to one embodiment of the invention, the peak-to-peak jitter value in the eye pattern was found to be 8.8 ps and the standard deviation of the jitter value of a recovered clock signal was found to be 1.14 ps.

Figure 21:
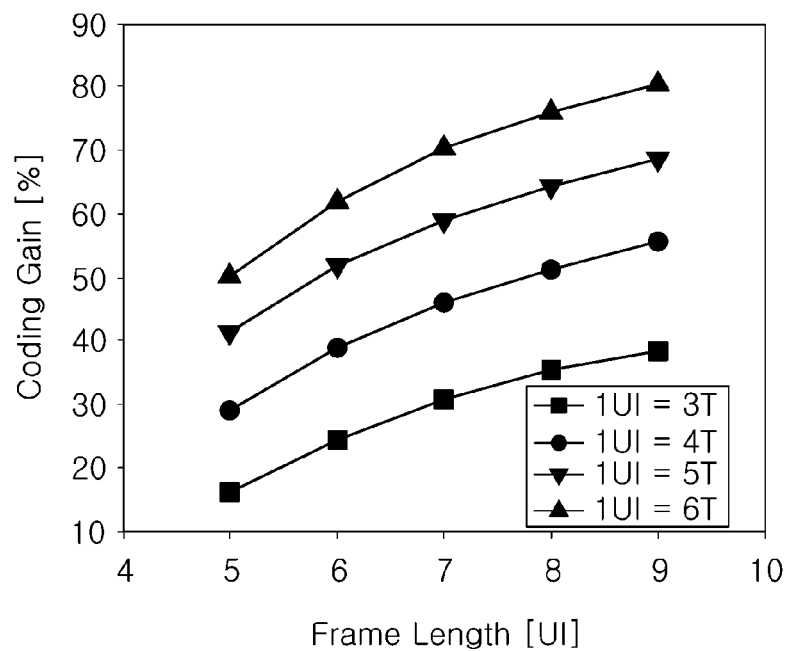
FIG. 21 shows a result of simulating a coding gain according to a length of a frame and a number of unit pulses constituting a minimum pulse width when transmission and reception are performed through a communication system according to one embodiment of the invention.

Meanwhile, FIG. 21 shows a result of simulating a coding gain according to a length of a frame and a number of unit pulses constituting a minimum pulse width (e.g., 1 UI) when transmission and reception are performed through a communication system according to one embodiment of the invention.

In the graph shown in FIG. 21, the horizontal axis represents the length of the frame and the vertical axis represents the coding gain. Here, it may be determined that the coding gain increases as the length of the frame or the number of unit pulses constituting the minimum pulse width (e.g., 1 UI) increases. That is, an increase in the length of the frame or the number of unit pulses constituting the minimum pulse width (e.g., 1 UI) may mean an increase in the number of cases in which certain information can be represented using one frame. Thus, in the communication system according to the invention, the coding gain may be adjusted on the basis of at least one of the length of the frame and the number of unit pulses constituting the minimum pulse width (e.g., 1 UI).

Meanwhile, when the length of the frame or the number of unit pulses constituting the minimum pulse width (e.g., 1 UI) increases in the communication system according to the invention, the processing load of the communication system increases and thus the length of the frame or the number of unit pulses constituting the minimum pulse width (e.g., 1 UI) may be predetermined or varied depending on a communication environment, a user selection, and the like.

Although the embodiments in which a signal is processed on the assumption that the minimum pulse width is 1 UI, the length of the frame is 6 UI, and the period T of unit pulses constituting the UI is 0.25 UI (or the number of unit pulses constituting the minimum pulse width is 4) have been mainly described above, the present invention is not necessarily limited to the length of the frame or the period T of unit pulses (or the number of unit pulses constituting the minimum pulse width) as described above, and any other embodiments in which, for example, the length of the frame is 3 UI and the period T of unit pulses constituting the UI is 0.5 UI (or the number of unit pulses constituting the UI is 2) are feasible as long as the objects of the invention may be achieved.

EXTENDED EMBODIMENTS

Although the embodiments in which a frame or an output bitstream is generated on the basis of widths and positions of pulses have been mainly described above, the present invention is not limited thereto and may be diversely changed such that a frame or an output bitstream is generated on the basis of a pulse value, a position of occurrence of a transition in the pulse value, and a number of occurrence of the transition in the pulse value.

That is, although it has been described above that an input bitstream is modulated by framing the input bitstream on the basis of widths and positions of pulses, an input bitstream may also be modulated by framing the input bitstream on the basis of at least one of a pulse value, a position of occurrence of a transition in the pulse value, and a number of occurrence of the transition in the pulse value.

For example, the encoding unit 120 according to one embodiment of the invention may generate a frame in which at least one position of occurrence of a transition in a pulse value is determined from an input bitstream. According to one embodiment of the invention, the position of occurrence of the transition may mean a position where the pulse value is changed (e.g., a position where the pulse value is changed from 0 to 1 or a position where the pulse value is changed from 1 to 0).

More specifically, the encoding unit 120 according to one embodiment of the invention may determine at least one position of occurrence of a transition in a pulse value on the basis of an input bitstream, and generate a frame on the basis of the at least one determined position of occurrence of the transition in the pulse value.

Further, the encoding unit 120 according to one embodiment of the invention may further determine the pulse value from the input bitstream, and generate a frame on the basis of the determined pulse value and at least one position of occurrence of a transition in the determined pulse value.

Furthermore, the encoding unit 120 according to one embodiment of the invention may further determine a number of occurrence of a transition in the pulse value from the input bitstream, and generate a frame on the basis of the determined number of occurrence of the transition in the pulse value and at least one position of occurrence of the transition in the pulse value.

Meanwhile, according to one embodiment of the invention, as a length of a frame or a number of unit pulses constituting a minimum pulse width of the frame may vary, at least one position of occurrence of a transition in a frame or a number of occurrence of the transition in the frame may vary depending on a communication environment, a user selection, and the like.

Further, according to one embodiment of the invention, as a coding gain may be adjusted on the basis of at least one of the length of the frame and the number of unit pulses constituting the minimum pulse width, a coding gain of pulse-width modulation may be adjusted on the basis of at least one of the length of the frame, the position of occurrence of the transition in the frame, and the number of occurrence of the transition in the frame.

Next, the decoding unit 220 according to one embodiment of the invention may detect information on at least one position of occurrence of a transition in a pulse value from a frame, and generate an output bitstream from the detected information.

For example, the decoding unit 220 according to one embodiment of the invention may generate a bitstream corresponding to at least one position of occurrence of a transition in a pulse value in a frame as an output bitstream, with reference to at least one of a lookup table and a combinational logic defined on the basis of properties of an input bitstream corresponding to the frame.

According to one embodiment of the invention, like the above-described communication system according to the invention, a communication system may be configured on the basis of the encoding unit 120 and the decoding unit 220 discussed in the above extended embodiments.

The embodiments according to the invention as described above may be implemented in the form of program instructions that can be executed by various computer components, and may be stored on a computer-readable recording medium. The computer-readable recording medium may include program instructions, data files, data structures and the like, separately or in combination. The program instructions stored on the computer-readable recording medium may be specially designed and configured for the present invention, or may also be known and available to those skilled in the computer software field. Examples of the computer-readable recording medium include the following: magnetic media such as hard disks, floppy disks and magnetic tapes; optical media such as compact disk-read only memory (CD-ROM) and digital versatile disks (DVDs); magneto-optical media such as floptical disks; and hardware devices such as read-only memory (ROM), random access memory (RAM) and flash memory, which are specially configured to store and execute program instructions. Examples of the program instructions include not only machine language codes created by a compiler or the like, but also high-level language codes that can be executed by a computer using an interpreter or the like. The above hardware devices may be configured to operate as one or more software modules to perform the processes of the present invention, and vice versa.

Although the present invention has been described above in terms of specific items such as detailed elements as well as the limited embodiments and the drawings, they are only provided to help more general understanding of the invention, and the present invention is not limited to the above embodiments. It will be appreciated by those skilled in the art to which the present invention pertains that various modifications and changes may be made from the above description.

Therefore, the spirit of the present invention shall not be limited to the above-described embodiments, and the entire scope of the appended claims and their equivalents will fall within the scope and spirit of the invention.

What is claimed is:

1. A signal processing method, wherein a frame including two or more pulses having a pulse width not less than a minimum pulse width is generated from an input bitstream, and
wherein the two or more pulses include at least one data pulse and at least one void pulse.

2. A signal processing method, wherein information on two or more pulses included in a frame and having a pulse width not less than a minimum pulse width is detected, and an output bitstream is generated from the detected information, and
wherein the two or more pulses include at least one data pulse and at least one void pulse.

3. The signal processing method of claim 1, wherein the frame further includes a pulse for distinction from another frame.

4. The signal processing method of claim 1, wherein a length of the frame is capable of being changed.

5. The signal processing method of claim 1, wherein a number of unit pulses constituting the minimum pulse width of the frame is capable of being changed.

6. The signal processing method of claim 1, wherein a coding gain of pulse-width modulation is capable of being adjusted on the basis of a length of the frame and a number of unit pulses constituting the minimum pulse width of the frame.

7. The signal processing method of claim 1, wherein at least one of a width and a position of the two or more pulses is determined with reference to at least one of a lookup table and a combinational logic defined on the basis of properties of the input bitstream.

8. The signal processing method of claim 1, wherein an odd-numbered frame or an even-numbered frame is inverted to maintain direct current (DC) balance.

9. A non-transitory computer-readable recording medium having stored thereon a computer program for executing the method of claim 1.

10. The signal processing method of claim 1,
wherein the minimum pulse width is 4 T and the pulse width of each pulse included in the frame is (4+N)T, and
wherein T is a period of unit pulses and N is an integer no less than 0.

11. The signal processing method of claim 2, wherein a bitstream corresponding to a width and a position of the two or more detected pulses is generated as the output bitstream, with reference to at least one of a lookup table and a combinational logic defined on the basis of properties of an input bitstream corresponding to the frame.

12. A non-transitory computer-readable recording medium having stored thereon a computer program for executing the method of claim 2.

13. The signal processing method of claim 2,
wherein the minimum pulse width is 4 T and the pulse width of each pulse included in the frame is (4+N)T, and
wherein T is a period of unit pulses and N is an integer no less than 0.

14. A signal processing system, comprising:
an encoder configured to generate a frame including two or more pulses having a pulse width not less than a minimum pulse width from an input bitstream,
wherein the two or more pulses include at least one data pulse and at least one void pulse.

15. The signal processing system of claim 14,
wherein the minimum pulse width is 4 T and the pulse width of each pulse included in the frame is (4+N)T, and
wherein T is a period of unit pulses and N is an integer no less than 0.

16. A signal processing system, comprising:
a decoder configured to detect information on two or more pulses included in a frame and having a pulse width not less than a minimum pulse width, and to generate an output bitstream from the detected information,
wherein the two or more pulses include at least one data pulse and at least one void pulse.

17. The signal processing system of claim 16,
wherein the minimum pulse width is 4 T and the pulse width of each pulse included in the frame is (4+N)T, and
wherein T is a period of unit pulses and N is an integer no less than 0.

18. A communication system, comprising:
an encoder configured to generate a frame including two or more pulses having a pulse width not less than a minimum pulse width from an input bitstream; and a decoder configured to detect information on two or more pulses included in a frame and having a pulse width not less than the minimum pulse width, and to generate an output bitstream from the detected information, wherein the two or more pulses include at least one data pulse and at least one void pulse.

\* \* \* \* \*